(12) United States Patent
Chen et al.

(10) Patent No.: US 9,470,750 B2
(45) Date of Patent: Oct. 18, 2016

(54) ALIGNMENT ADJUSTING MECHANISM FOR PROBE CARD, POSITION ADJUSTING MODULE USING THE SAME AND MODULARIZED PROBING DEVICE

(71) Applicant: MPI CORPORATION, Chu-Pei City, Hsinchu Shien (TW)

(72) Inventors: Tsung-Yi Chen, Hsinchu Shien (TW); Chung-Tse Lee, Hsinchu Shien (TW); Shih-Shin Chen, Hsinchu Shien (TW)

(73) Assignee: MPI CORPORATION, Chu-Pei, Hsinchu Shien (TW)

( * ) Notice: Subject to any disclaimer, the term of this patent is extended or adjusted under 35 U.S.C. 154(b) by 179 days.

(21) Appl. No.: 14/253,675

(22) Filed: Apr. 15, 2014

(65) Prior Publication Data

US 2014/0306730 A1   Oct. 16, 2014

(30) Foreign Application Priority Data

Apr. 16, 2013 (TW) .............................. 102113400 U
Apr. 16, 2013 (TW) .............................. 102206910 U

(51) Int. Cl.
   *G01R 31/28* (2006.01)
   *G01R 1/073* (2006.01)

(52) U.S. Cl.
   CPC ....... *G01R 31/2889* (2013.01); *G01R 1/07378* (2013.01)

(58) Field of Classification Search
   CPC ......... G01R 1/067; G01R 1/04; G01D 21/00
   See application file for complete search history.

(56) References Cited

U.S. PATENT DOCUMENTS

| 6,509,751 B1 | 1/2003 | Mathieu et al. |
| 7,721,430 B2 * | 5/2010 | Chartarifsky ............ G01R 3/00 257/693 |

(Continued)

FOREIGN PATENT DOCUMENTS

| JP | 2009-265065 A | 11/2009 |
| TW | 293938 | 12/1996 |

(Continued)

*Primary Examiner* — Huy Q Phan
*Assistant Examiner* — Alvaro Fortich
(74) *Attorney, Agent, or Firm* — Muncy, Geissler, Olds & Lowe, P.C.

(57) ABSTRACT

An alignment adjusting mechanism for a probe card includes a frame, a substrate and positioning screws. The frame has an opening, an inner periphery wall surrounding around the opening, and an outer periphery wall corresponding to the inner periphery wall. The substrate is disposed in the opening and supported by a support flange extending from the inner periphery wall toward a center of the opening. The frame is provided with a plurality of positioning threaded holes each extending from the outer periphery wall to the inner periphery wall in communication with the opening. Each positioning screw is threaded into one of the positioning threaded holes and has an end stopped at a lateral side of the substrate. By turning the positioning screws, the planimetric position of the substrate on an imaginary plane is adjustable.

18 Claims, 14 Drawing Sheets

(56) References Cited

U.S. PATENT DOCUMENTS

| | | | | |
|---|---|---|---|---|
| 8,901,948 B2* | 12/2014 | Wang | G01R 1/07378 324/207.25 |
| 2007/0007977 A1* | 1/2007 | Eldridge | G01R 31/2889 324/756.03 |
| 2008/0108221 A1* | 5/2008 | Kim | C25D 1/00 438/652 |
| 2008/0174326 A1* | 7/2008 | Jeon | G01R 1/07342 324/754.07 |
| 2009/0184727 A1* | 7/2009 | Kim | G01R 1/07378 324/754.07 |
| 2009/0219043 A1* | 9/2009 | Nakayama | G01R 31/2889 324/762.05 |
| 2009/0260459 A1* | 10/2009 | Kim | G01R 1/07307 73/866.5 |
| 2010/0001752 A1* | 1/2010 | Yamada | G01R 31/2891 324/756.01 |
| 2011/0254577 A1* | 10/2011 | Kuo | G01R 31/2889 324/756.03 |
| 2012/0169367 A1 | 7/2012 | Kuo et al. | |

FOREIGN PATENT DOCUMENTS

| | | |
|---|---|---|
| TW | I266057 B | 11/2006 |
| TW | M366073 U | 10/2009 |
| TW | M385788 U | 8/2010 |
| TW | I378245 B | 12/2012 |
| TW | I408373 B | 9/2013 |
| WO | 2007/066622 A1 | 6/2007 |

* cited by examiner

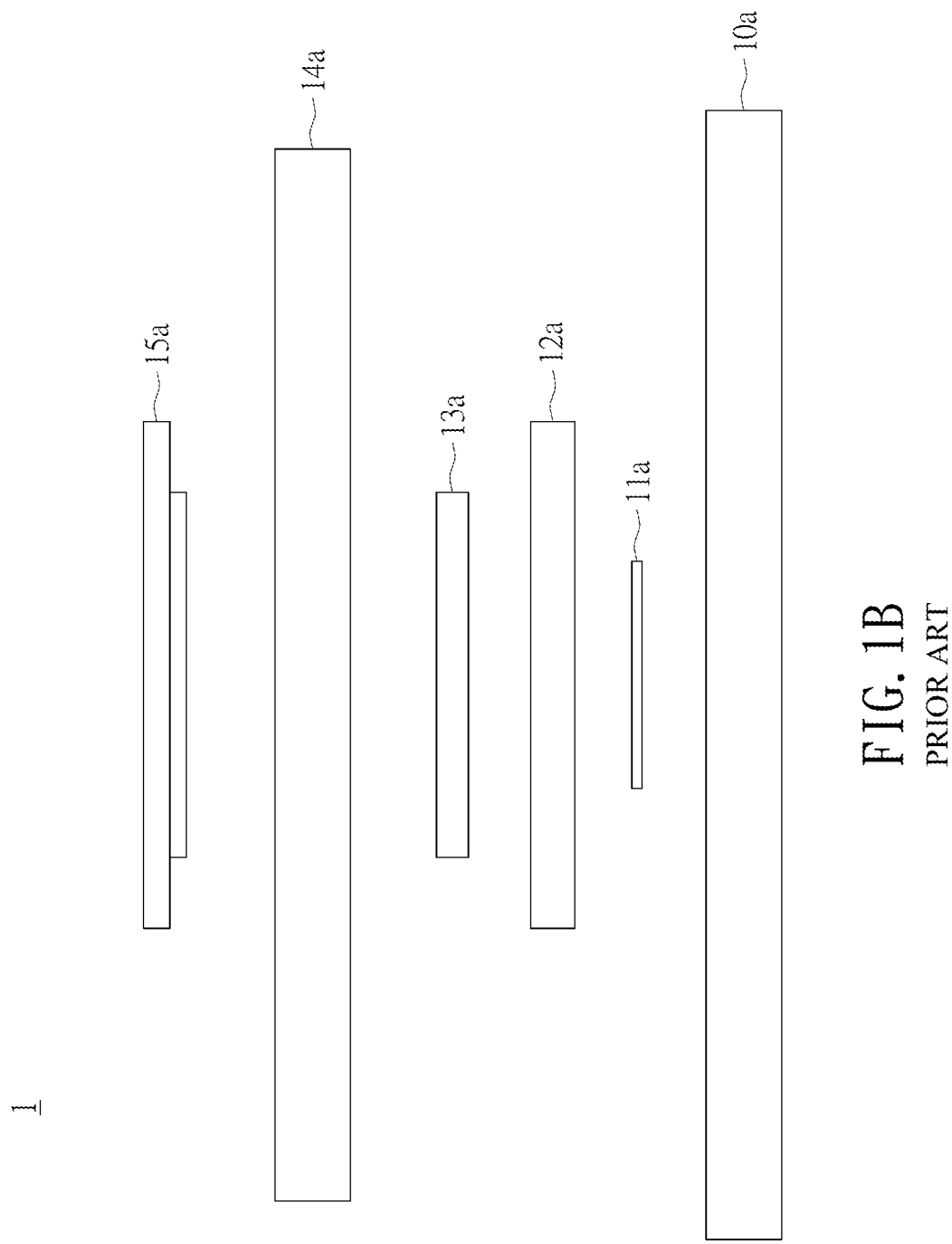

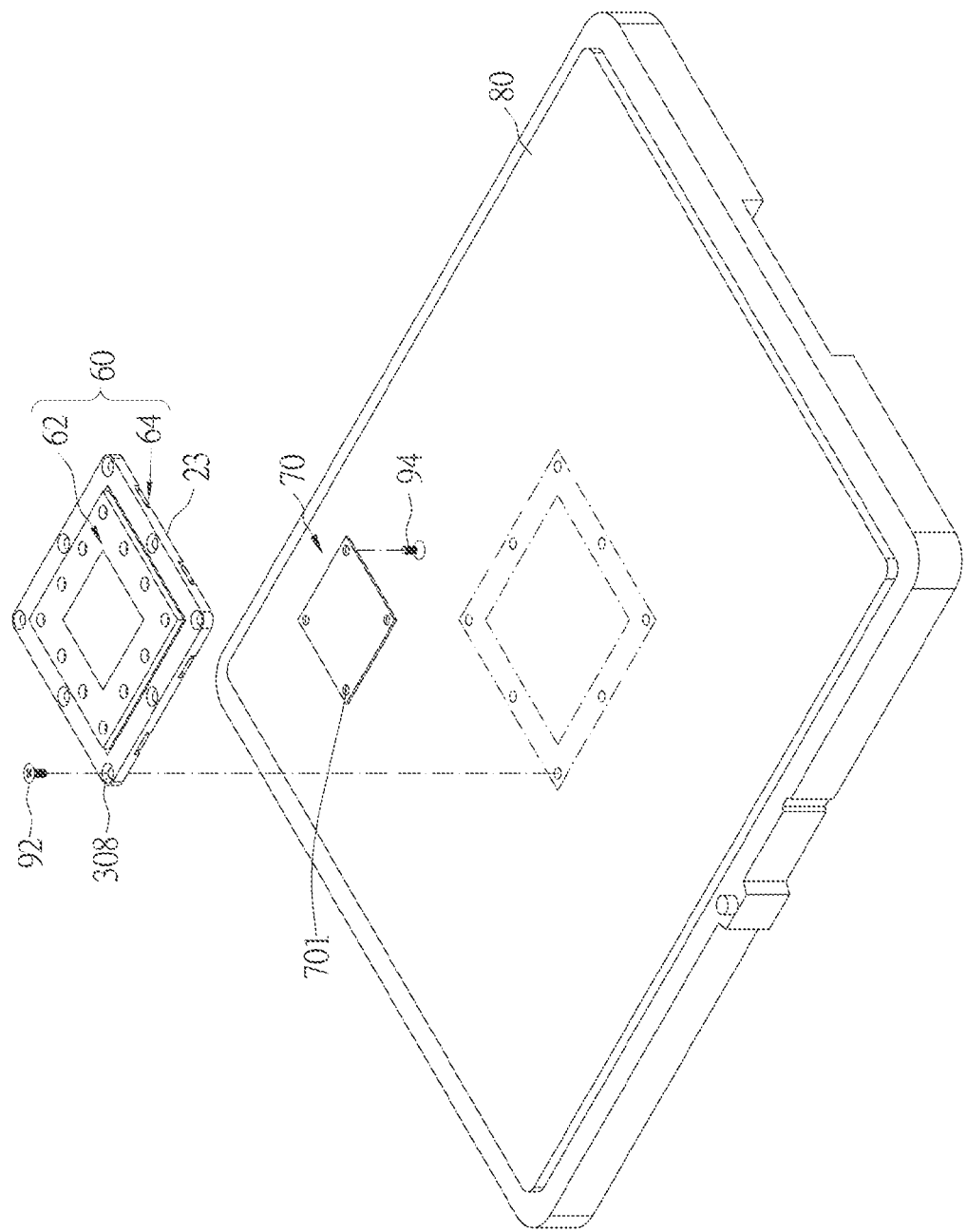

ALIGNMENT ADJUSTING MECHANISM FOR PROBE CARD, POSITION ADJUSTING MODULE USING THE SAME AND MODULARIZED PROBING DEVICE

CROSS-REFERENCE TO RELATED APPLICATIONS

This application claims priorities from Taiwan Patent Application Nos. 102113400 and 102206910 both filed on Apr. 16, 2013, the entire contents of which are incorporated herein by reference.

BACKGROUND OF THE INVENTION

1. Field of the Invention

The present invention relates generally to alignment adjusting mechanisms and more particularly, to an alignment adjusting mechanism for a probe card. The present invention also relates to a position adjusting module using the aforesaid alignment adjusting mechanism, and a modularized probing device using the position adjusting module.

2. Description of the Related Art

It is well-known that a device under test (hereinafter referred to as "DUT"), such as a die on a wafer, is indirectly contacted with a testing apparatus through a probe card. By means of signal transmission and analysis, electric characteristics of the DUT can be obtained. The conventional probe card generally comprises fine probe needles arranged in a desired manner that each probe needle corresponds in location to a predetermined contact of the DUT, such that the probe needles can positively transmit testing signals from the testing apparatus to the DUT when contacting the corresponding contacts of the DUT. The electric characteristics of the DUT can be thus measured by running control and analysis procedures of the probe card and the testing apparatus.

FIG. 1A shows a conventional probe card. The conventional probe card is formed by bonding a probe head 10, a space transforming substrate 11 and a circuit board 12 together by soldering. It is found that either probe head 10 or circuit board 12 will be easily damaged due to the processing error or mistake in soldering. The conventional probe card may undergo a desoldering process when it is malfunction and needs to be repaired. However, performing desoldering process will have a great risk of damaging the circuit board 12, the space transforming substrate 11 or the probe head 10.

To solve the problems of the above-mentioned conventional probe card, a probe card formed by combinedly and detachably assembling the probe head, space transforming substrate and the circuit board together is developed in lieu of the probe card assembled by soldering. Such combination-type probe card can be seen in Taiwan Patent Publication Nos. M385788 and M366073. However, because of lack of any alignment adjusting mechanism in these probe cards disclosed in aforesaid patens, the mismatch in alignment resulted from assembly errors can not be adjusted and compensated. In other words, these probe cards disclosed in aforesaid patents may encounter a problem of alignment which needs to be further improved.

FIG. 1B shows a vertical probe card 1 according to another prior art. The vertical probe card 1 is composed of a printed circuit board 10a, a conductive adhesive film 11a electrically connected with the printed circuit board 10a, a lower frame 12a threadedly mounted to the printed circuit board 10a after alignment, a space transformer 13a electrically connected with the conductive adhesive film 11a, an upper frame 14a threadedly mounted to the printed circuit board 10a after alignment, and a probe head 15a having a plurality of vertical probe needles regularly arranged in a matrix manner and electrically connected with the space transformer 13a. When the vertical probe card 1 is assembled, the conductive adhesive film 11a, lower frame 12a, space transformer 13a, upper frame 14a and the probe head 15a are orderly installed on the printed circuit board 10a one after another after they are aligned with respect to each other. Since the parts of this conventional vertical probe card 1 need to be aligned one by one during assembly, the assembly of the conventional vertical probe card 1 is time-consuming This disadvantage may delay delivery or shipment of the resultant products.

Further, because the other parts of the above-mentioned vertical probe card 1 are orderly installed on the printed circuit board 10a one after another, these parts have only alignment relationship without fastening relationship therebetween. When the vertical probe card 1 is dismantled, these parts need to be detached one by one too. This dismantling procedure is also time-consuming Furthermore, when the conventional vertical probe card 1 is badly in need of repair, because the user of test plant can not repair the vertical probe card 1 by himself in practice, the conventional vertical probe card 1 needs to be returned to the supplier for repair. This is time-consuming too. In addition, printed circuit boards 10 of same specification may not be commonly used in the conventional vertical probe cards 1 because the user in test plant can not assemble or dismantle the vertical probe card 1 by himself. In other words, the conventional vertical probe card 1 has the disadvantages of consuming time in assembling and disassembling, inconvenience in dismantling and replacing parts, and difficulty in repair.

In light of above, it is needed to develop an alignment adjusting mechanism adapted for being used in a probe card, a position adjusting module using the aforesaid alignment adjusting mechanism, and a modularized probing device to improve the disadvantages of the conventional probe cards mentioned above.

SUMMARY OF THE INVENTION

The present invention has been accomplished in view of the above-noted circumstances. It is an objective of the present invention to provide an alignment adjusting mechanism for a probe card, which utilizes a planimetric position adjusting structure to adjust the position of the substrate inside a substrate frame for allowing the pads of the substrate to be accurately positioned, thereby facilitating assembly of the substrate with a conductive film required in the probe card.

It is another objective of the present invention to provide a position adjusting module for a probe card, which can accurately position the pads of a substrate to facilitate assembly of the substrate with a support board required in the probe card.

It is still another objective of the present invention to provide an alignment adjusting mechanism for a probe card and a position adjusting module using the same, which can save time in assembly or disassembly and have the advantage of convenience in dismantling because parts thereof need not to be orderly aligned one after another on a support board during assembly and disassembly.

It is still another objective of the present invention to provide an alignment adjusting mechanism for a probe card and a position adjusting module using the same, which have the advantages of ease in replacing parts, saving costs, and convenience in repair because the parts need not to be orderly aligned one after another during assembly and disassembly.

It is still another objective of the present invention to provide a modularized probing device for a probe card, which has the advantages of ease in replacing parts, saving costs, and convenience in repair because the parts thereof need not to be orderly aligned one after another during assembly and disassembly.

In an embodiment of the present invention, an alignment adjusting mechanism for a probe card is provided comprising a frame, a substrate and a planimetric position adjusting structure. The frame has an opening, an inner periphery wall surrounding the opening, a support flange extending from the inner periphery wall towards a center of the opening, and an outer periphery wall. The substrate is disposed in the opening of the frame and supported by the support flange. The planimetric position adjusting structure includes a plurality of positioning threaded holes each penetrating through the frame from the outer periphery wall to the inner periphery wall, and a plurality of positioning screws each threaded into one of the positioning threaded holes and having an end stopped at a lateral side of the substrate. Preferably, the frame is a single element. In another embodiment, the frame is composed of a substrate frame holding the substrate and a support frame holding the substrate frame. The planimetric position adjusting structure may be provided at the substrate frame or the support frame.

In another embodiment of the present invention, a position adjusting module for a probe card is provided comprising an assembly of a substrate frame and a support frame, a substrate, and a planimetric position adjusting structure. The assembly is provided with an opening, an inner periphery wall surrounding the opening, a support flange extending from the inner periphery wall towards a center of the opening, and an outer periphery wall. The substrate is disposed in the opening of the assembly and supported by the support flange. The planimetric position adjusting structure includes a plurality of positioning threaded holes each penetrating through one of the substrate frame and the support frame from the outer periphery wall to the inner periphery wall, and a plurality of positioning screws each threaded into one of the positioning threaded holes and having an end stopped at a lateral side of the substrate. Preferably, the positioning threaded holes are provided at the substrate frame. In another embodiment of the present invention, the positioning threaded holes are however provided at the support frame.

In still another embodiment of the present invention, a modularized probing device is provided for being detachably and electrically connected with a support board of a probe card. The modularized probing device comprises a holder, a space transformer, a planimetric position adjusting structure, and a probe head. The holder is adapted for being detachably mounted to the support board of the probe card. The holder has a receiving space. The space transformer is received in the receiving space of the holder and has a first surface adapted for being electrically connected with the support board of the probe card and a second surface opposite to the first surface. The planimetric position adjusting structure includes a plurality of positioning threaded holes provided at the holder, and a plurality of positioning screws each threaded into one of the positioning threaded holes and having an end protruding into the receiving space of the holder. The ends of the positioning screws are stopped at a lateral side of the space transformer. The probe head is detachably mounted to the holder and provided with a plurality of probe needles electrically connected with the second surface of the space transformer. The holder may be configured by a single frame holding the space transformer on the support board of the probe card. In another embodiment of the present invention, the frame is composed of a substrate frame holding the space transformer and a support frame holding the substrate frame. The planimetric position adjusting structure may be provided at the substrate frame or the support frame. Preferably, the planimetric position adjusting structure is provided at the substrate frame having a first opening receiving therein the space transformer, an inner periphery wall surrounding around the first opening, an outer periphery wall surrounding around the inner periphery wall, and a first support flange extending from the inner periphery wall and supporting the space transformer in such a way that each of the positioning threaded holes is configured penetrating through the substrate frame from the outer periphery wall to the inner periphery wall of the substrate frame.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein:

FIG. 1B is a schematic perspective view of a vertical probe card according to a prior art;

FIG. 4 is a schematic perspective view illustrating an assembled modularized probing device, an anisotropic conductive layer and a support board;

DETAILED DESCRIPTION OF THE INVENTION

The present invention is to disclose an alignment adjusting mechanism, a position adjusting module using the alignment adjusting mechanism, and a modularized probing device for being used in a probe card. Since the principle of use and basic function of the probe card are well known for a person skilled in the art, the detailed description thereof will not be positively recited thereunder for purpose of concise illustration. Further, it is to be understood that the drawings disclosed in the present invention are given by way of schematically illustrating the structural features of the present invention only; therefore, they are not, or need not to be, sketched according to actual dimension in detail.

Figure 1A:
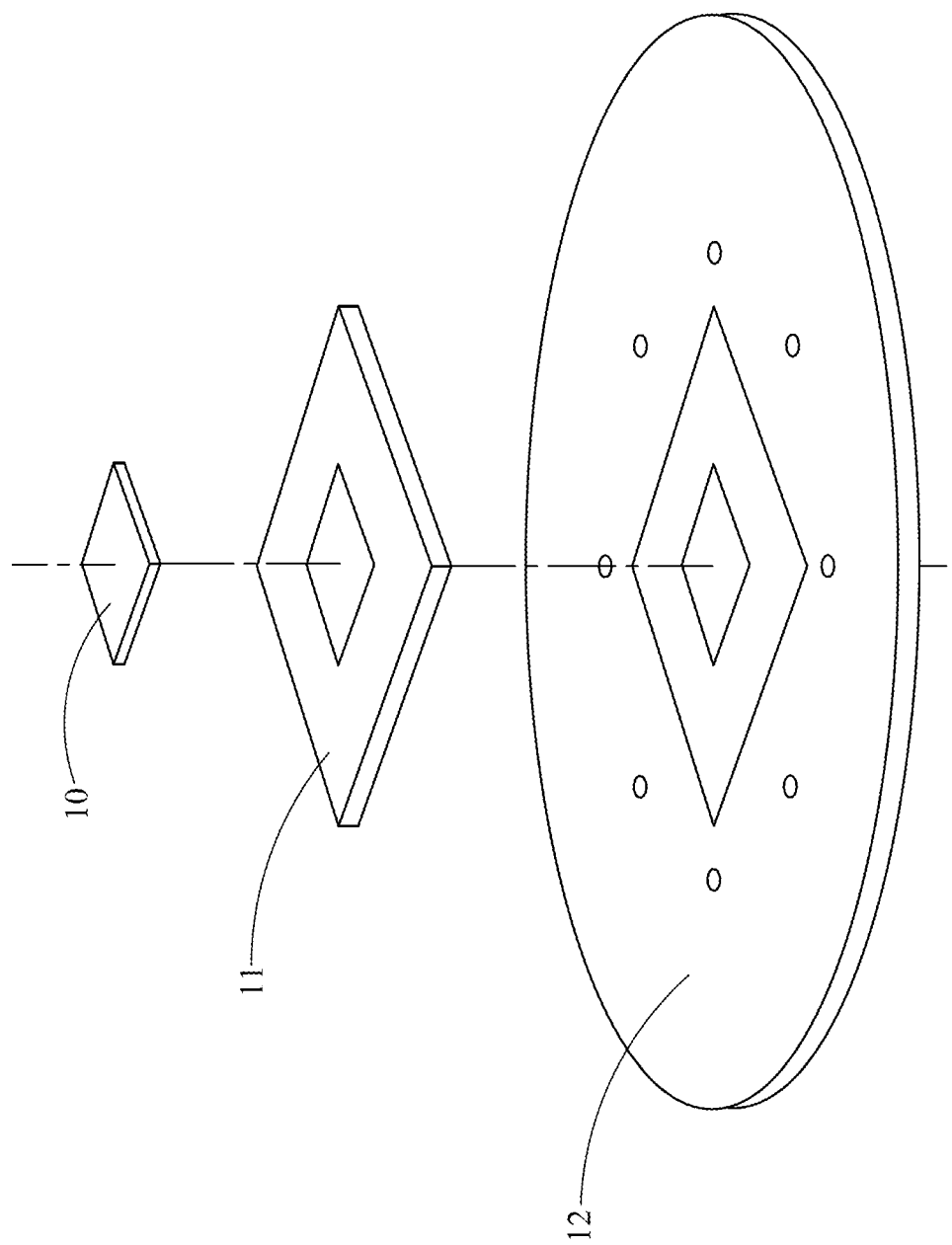
FIG. 1A is a schematic perspective view of a probe card according to a prior art.
Figure 2A:
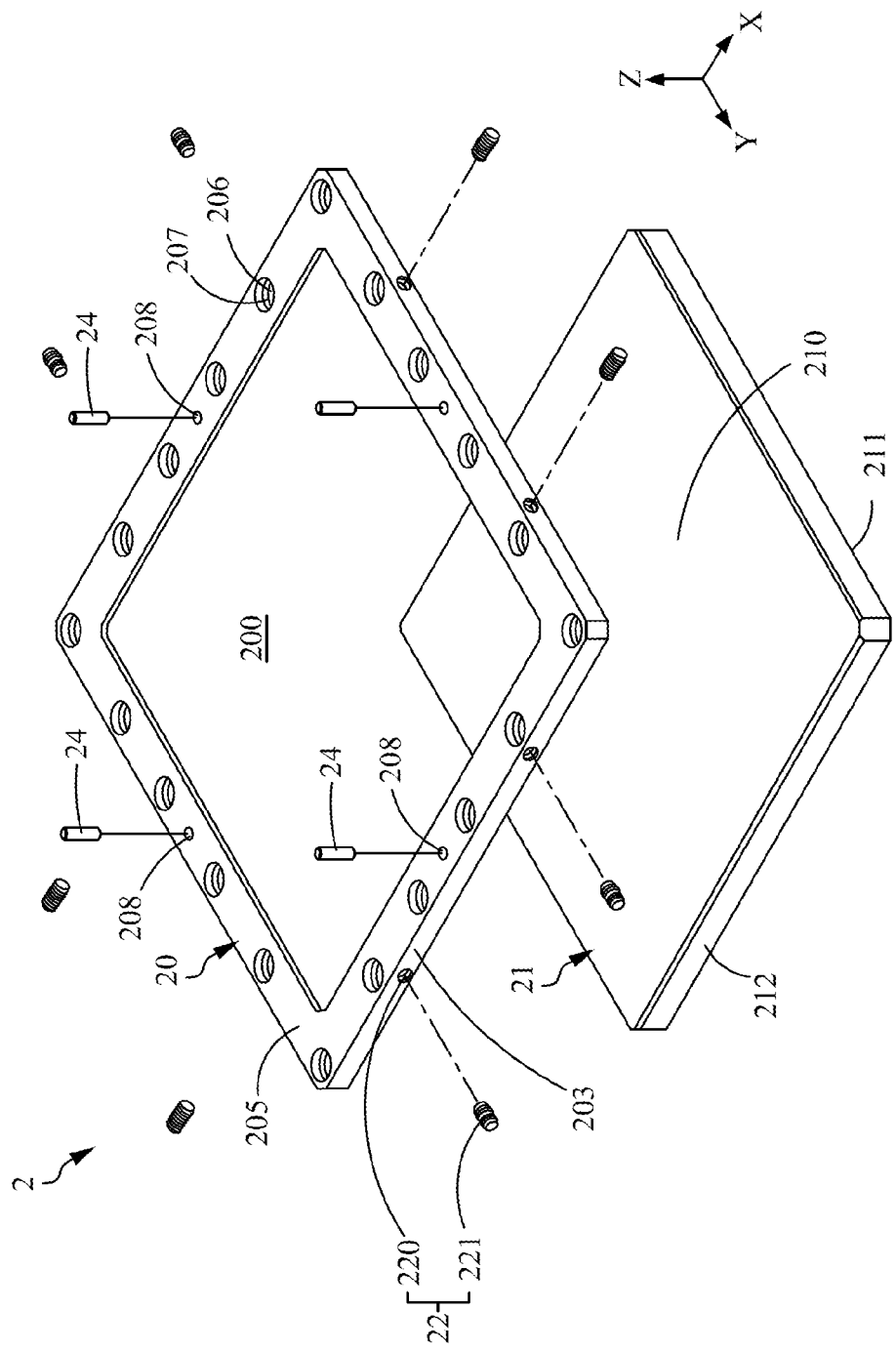
FIG. 2A is a schematically exploded view of an alignment adjusting mechanism according to an embodiment of the present invention.
Figure 2B:
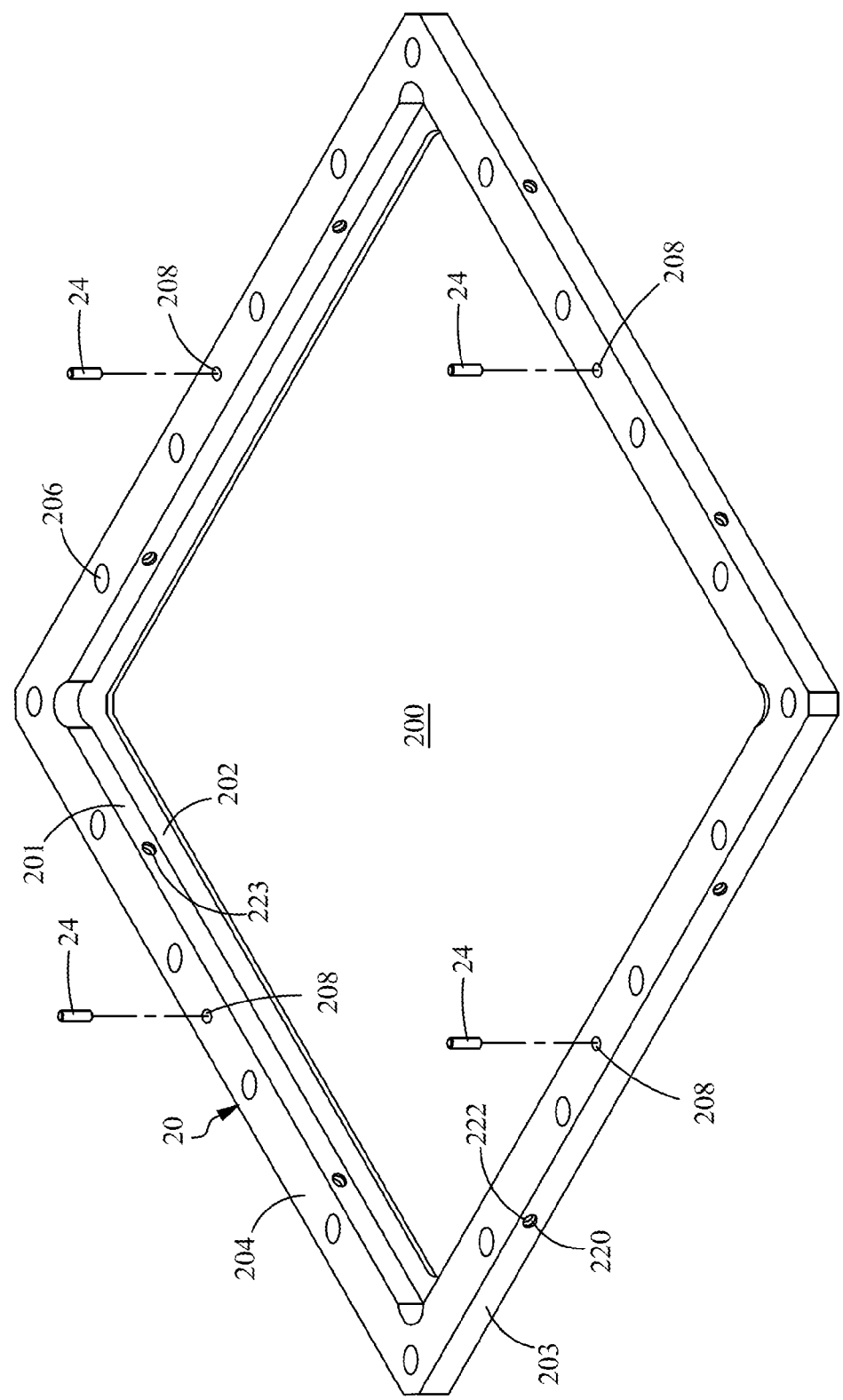
FIG. 2B is a schematic perspective view of the substrate frame shown in FIG. 2A but viewed from another angle.

FIG. 2A is a schematically exploded view of an alignment adjusting mechanism according to an embodiment of the present invention, and FIG. 2B is a schematic perspective view of the substrate frame shown in FIG. 2A but viewed from another angle. As shown in FIG. 2A, an alignment adjusting mechanism 2 provided in this embodiment comprises primarily a substrate frame 20, a substrate 21 and a planimetric position adjusting structure 22. Referring to FIG. 2A and 2B, the substrate frame 20 includes a first opening 200 and a first support flange 202 extending from an inner periphery wall 201 that surrounds around the first opening 200 towards a center of the first opening 200. The substrate frame 20 has a first surface 204 and a second surface 205 opposite to the first surface 204. In this embodiment, the support flange 202 is configured to integrally and smoothly extend from the second surface 205 towards the center of the first opening 200; however, the structure of the support flange 202 is not limited to this design. For example, in another embodiment, the support flange 202 may extend from a location of the inner periphery wall 201 between the first surface 204 and the second surface 205 towards the center of the first opening 200. Further, in this embodiment, the substrate frame 20 is a rectangular frame having four side members perpendicularly connected one after another, and each side member is provided with at least one positioning threaded hole 220. It is to be mentioned that shape of the substrate frame 20 can be designed subject to actual requirement of user; therefore, it is not limited to a rectangular one. For example, circular frame, oval frame, or polygonal frame may be used as the substrate frame 20 of the present invention. Furthermore, the substrate frame 20 has a plurality of first through holes 206 each penetrating through the first surface 204 and the corresponding second surface 205. As shown in FIG. 2A, counterbores 207 are formed on the second surface 205, and each counterbore 207 is communicated with one of the first through holes 206. On the second surface 205 of the substrate frame 20, a plurality of the alignment grooves 208 are provided and extend in a Z-axis direction. Each alignment groove 208 is received with an alignment pin 24. By means of the alignment grooves 208 and alignment pins 24, the position of substrate 21 can be located. The alignment grooves 208 may be configured penetrating through the substrate frame 20 as disclosed in this embodiment. Alternatively, the alignment grooves 208 may not penetrate through the substrate frame 20. It will be appreciated that each side member of the substrate frame 20 is provided at the middle thereof with one alignment groove 208 in this embodiment; however, the number and locations of the alignment grooves 208 are not limited to the design in this embodiment.

Referring to FIGS. 2A and 2B again, the substrate 21 is disposed in the first opening 200 and supported on the first support flange 202. The substrate 21 provided in this embodiment serves as a space transformer. That is, pads on a surface 210 of the substrate 21 and pads on an opposite surface of the substrate 21 are respectively and electrically connected together and have different distribution and density. The distribution and density of the pads on both surfaces of the substrate 21 are not specifically limited. Nevertheless, the distribution and density of these pads are normally designed subject to the type and requirement of devices under test. Since the mechanism of space transformer used in probe card is well known for a person skill in the art, the detailed discussion thereof needs not to be described herein. For the substrate 21, a single substrate is used in this embodiment; however, a multi-layered ceramic (MLC) member, a multi-layered organic (MLO) member, or a multi-layered silicon member may be used. In another embodiment, as shown in FIG. 7C, the substrate 21 comprises a combination of a multi-layered ceramic member 21a and a multi-layered organic member 21b. In an alternate form, a combination of a multi-layered ceramic (MLC) member and a flexible printed circuit board (FPCB) may be used as the substrate 21.

Referring to FIG. 2A again, the planimetric position adjusting structure 22 is provided at the substrate frame 20 and cooperatively works on the substrate 21 for adjusting the position of the substrate 21 located on a plane which is defined as the XY plane in this embodiment. In other words, the planimetric position adjusting structure 22 can drive the substrate 21 to move in X-axis and/or Y-axis so as to adjust the position of the substrate 21 on the XY plane. In this embodiment, the planimetric position adjusting structure 22 comprises a plurality of positioning threaded holes 220 and a plurality of positioning screws 221. The positioning threaded holes 220 are provided at the substrate frame 20 in a way that each positioning threaded hole 220 penetrates through the substrate frame 20 from an outer periphery wall 203 to the inner periphery wall 201, such that each positioning threaded hole 220 has an opening 222 on the outer periphery wall 203 and an opening 223 on the inner periphery wall 201 in communication with the first opening 200 of the substrate frame 20. The positioning screws 221 are screwingly threaded into the positioning threaded holes 220, respectively. Each positioning screw 221 has an end passing through the opening 223 on the inner periphery wall 201 and being firmly stopped at a lateral side 212 of the substrate 21. In this embodiment, the planimetric position adjusting structure 22 has a plurality of positioning structure units, provided that one positioning screw 221 and one associated positioning threaded hole 220 combinedly serve as a unit of positioning structure. Further, the substrate frame 20 is a rectangular frame having perpendicularly connected four side members, and each side member is equipped with two units of positioning structure. However, it is to be mentioned that the number of the positioning structure units provided at each side member of the substrate frame 20 is not limited to two. Based on the dimension of the substrate 21 used and the desired adjusting effect required, one or more positioning structure units may be properly provided at each side member of the substrate frame 20. By means of the planimetric position adjusting structure 22, the position of the substrate 21 inside the substrate frame 20 can be adjusted so as to accurately position the pads of the substrate 21 for facilitating assembly of the substrate 21 with an electrically conductive layer 70 of a probe card, as shown in FIG. 4.

Figure 3A:
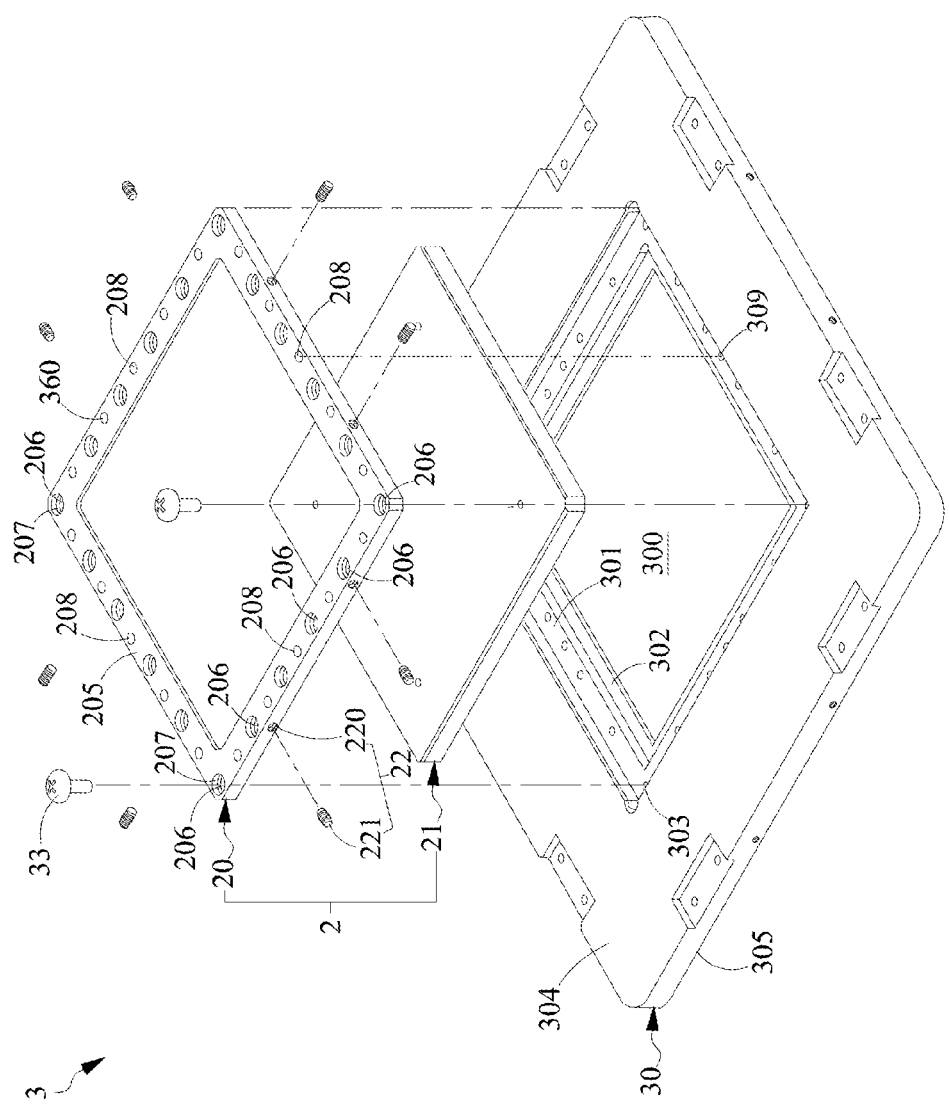
FIG. 3A is a schematically exploded view of a position adjusting module according to an embodiment of the present invention.

Referring to FIG. 3A which is a schematically exploded view of a position adjusting module of the present invention, the position adjusting module 3 comprises the above-mentioned alignment adjusting mechanism 2 and a support frame 30. Since the structural features of the alignment adjusting mechanism 2 comprising the substrate frame 20, substrate 21 and the planimetric position adjusting structure 22 have been illustrated in the preceding paragraphs, the detail of the aforesaid structural features will not be repeatedly discussed hereinafter. As shown in FIG. 3A, the support frame 30 includes a second opening 300 for receiving therein the substrate frame 20, and a second support flange 301 extending from an inner periphery wall that surrounds around the second opening 300 for supporting the substrate frame 20. In this embodiment, the first surface 204 of the substrate frame 20, i.e. the surface opposite to the second surface 205 of the substrate frame 20, faces and corresponds in location to the second support flange 301. The support frame 30 further includes a third support flange 302 extending from an inner periphery wall of the second support flange 301 that corresponds to the second opening 300. The third support flange 302 is adapted for supporting the substrate 21 when the alignment adjusting mechanism 2 is mounted to the support frame 30. In another embodiment, the planimetric position adjusting structure 22 is provided at the support frame 30, as shown in FIG. 7B. In this case, the support frame 30 further includes positioning threaded holes 220 into which positioning screws 221 are threadedly inserted, respectively. In other words, the planimetric position adjusting structure 22 is now formed by the positioning threaded holes 220 provided at the support frame 30 and the positioning screws 221, and the lateral side 212 of the substrate 21 is stopped by the positioning screws 221 engaged in the positioning threaded holes 220 of the support frame 30. Referring to FIG. 3A again, the second support flange 301 is provided with a plurality of insertion holes 309 corresponding in location to the alignment grooves 208 of the substrate frame 20, such that the alignment pins 24 that are respectively inserted in the alignment grooves 208 extend further into the insertion holes 309 respectively, so that the position of the substrate 21 can be determined and confirmed. In this embodiment, each side member of the support frame 30 is provided with one insertion hole 309; however, the number and locations of the insertion holes 309 are not limited to the design of this embodiment.

As shown in FIG. 3A, the support frame 30 has a third surface 304 and a fourth surface 305 opposite to the third surface 304, and the alignment adjusting mechanism 2 is mounted to the support frame 30 at the side having the third surface 304. Referring to FIG. 3D which is a schematic cutaway view taken along the line 3D-3D of FIG. 3C, the position adjusting module 3 further comprises a plurality of first threaded holes 303 provided at the second support flange 301 and respectively aligned with the first through holes 206 that penetrate through the first surface 204 and the second surface 205 of the substrate frame 20, and a plurality of first fastening screws 33 respectively threaded into the first threaded holes 303 through the first through holes 206 for fixedly fastening the substrate frame 20 to the support frame 30. It is to be mentioned that because the counterbore 207 is provided in communication with the first through hole 206, the head of the first fastening screw 33 will be totally received in the counterbore 207 without protruding out of the second surface 205 when the first fastening screw 33 is used to fasten the substrate frame 20 to the support frame 30. In this way, the first fastening screw 33 that is sunk below the second surface 205 will not adversely affect the electric contacts (not shown) of the circuit board when the position adjusting module 3 is electrically mounted to the circuit board. Besides, the design of counterbores 207 enables the substrate frame 20 to move on the support frame 30 in XY plane, facilitating adjustment of the position of the substrate frame 20.

Referring to FIG. 3A again, when the position adjusting module 3 is in use, the substrate 21 has a surface that is electrically coupled to a circuit board (not shown) of the probe card in a way that the third surface 304 faces the circuit board, and an opposite surface that is electrically coupled to a probe head (not shown) of the probe card in a way that the fourth surface 305 faces the probe head. It is to be understood that an electrically conductive layer (not shown) of the probe card may be electrically disposed between the substrate 21 and the circuit board. The electrically conductive layer may be installed on the circuit board in advance, and then the position adjusting module 3 is mounted to the circuit board by screws so as to achieve the electric connection between the substrate 21 and the circuit board through the electrically conductive layer. Alternatively, the electrically conductive layer may be mounted to the position adjusting module 3 by screws in advance, and then the electric connection between the substrate 21 and the circuit board can be done by mounting the position adjusting module 3 to the circuit board. It is to be mentioned that the aforesaid probe head may be a needle module used in a cantilever probe card (CPC) or a vertical probe card (VPC), or any suitable needle module according to actual need.

Figure 3B:
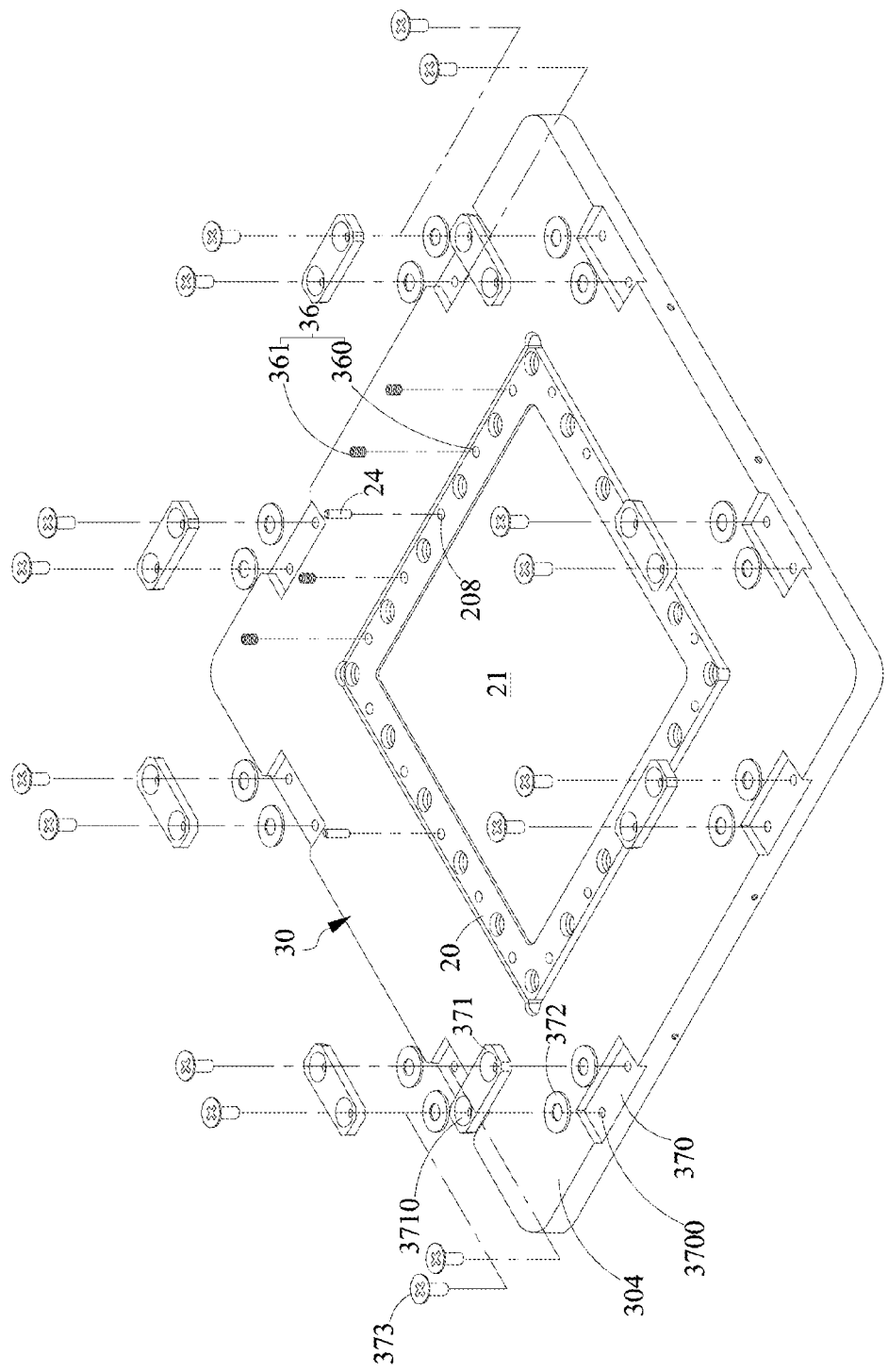
FIG. 3B is a schematic perspective view of the position adjusting module of the present invention, in which an elevation adjusting structure is explodedly shown.
Figure 3C:
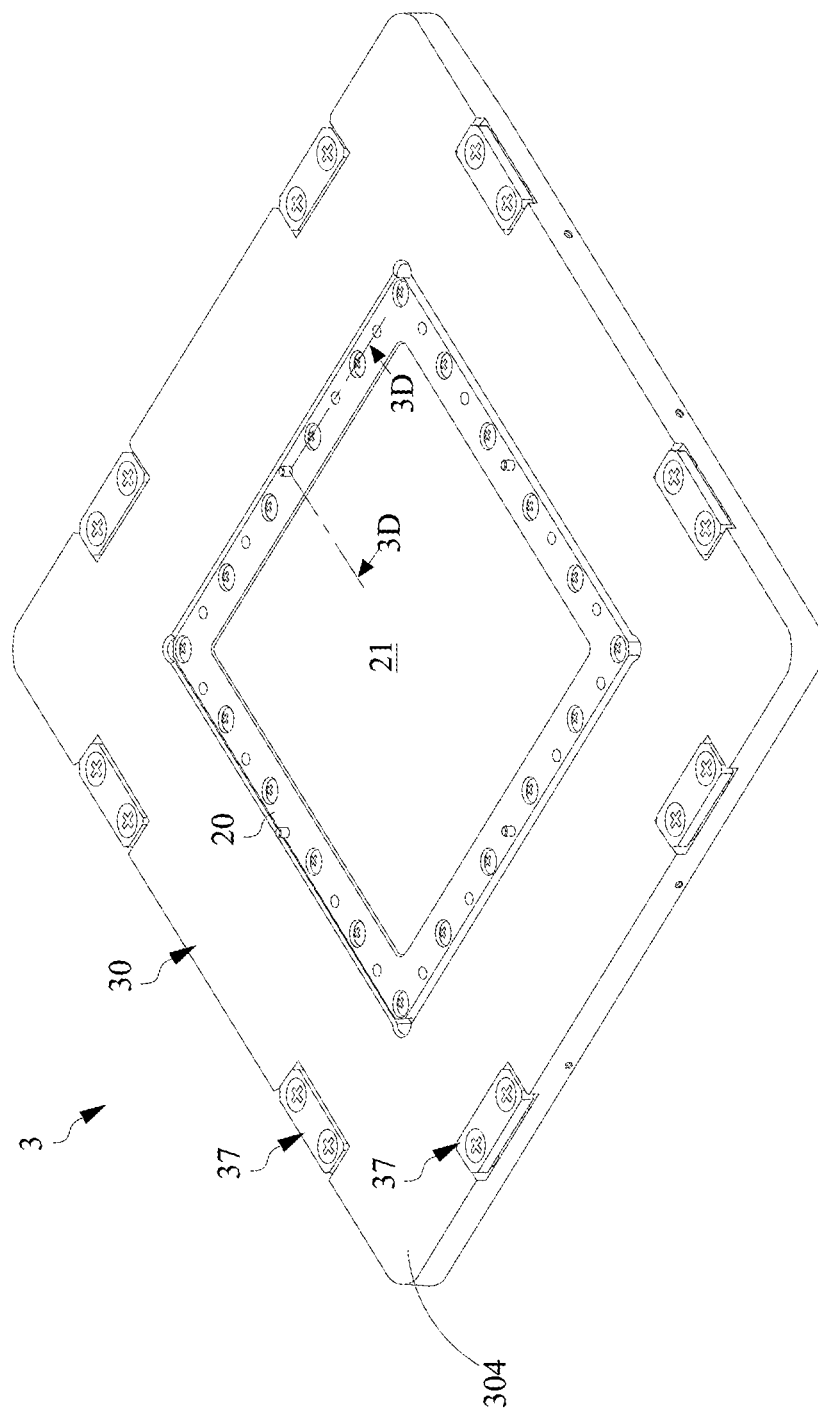
FIG. 3C is a schematic perspective view of the position adjusting module of the present invention, in which the elevation adjusting structure is assembled with the support frame.
Figure 3D:
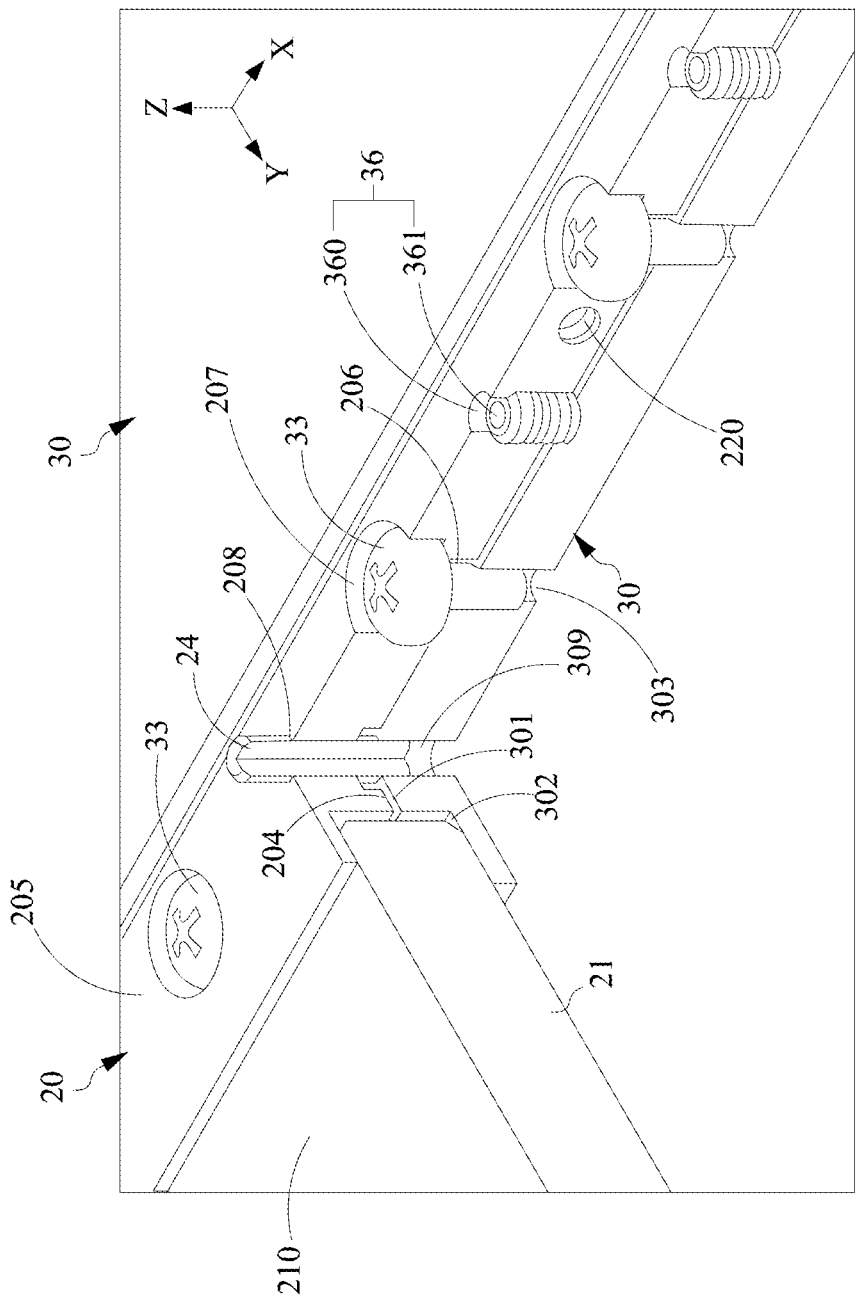
FIG. 3D is a schematic cutaway view illustrating the combination of the substrate frame, the substrate and the support frame and taken along the line 3D-3D of FIG. 3C.

FIG. 3B and FIG. 3C show an elevation adjusting structure 37 used in the position adjusting module 3 in an exploded manner and in an assembled manner, respectively. FIG. 3D, which is a schematic cutaway view taken along the line 3D-3D of FIG. 3C, shows a clamp adjusting structure 36 used in the position adjusting module 3. As shown in FIGS. 3B and 3D, the clamp adjusting structure 36 comprises a plurality of adjusting threaded holes 360 penetrating through the substrate frame 20 and aimed at and communicated with the second support flange 301 of the support frame 30, and a plurality of adjusting screws 361 each threaded into one of the adjusting threaded holes 360 and having an end stopped at the second support flange 301 of the support frame 30. In this embodiment, each side member of the substrate frame 20 is provided with several adjusting threaded holes 360; however, the number of the adjusting threaded holes 360 is determined subject to the size of the substrate frame 20 and not limited to the design of this embodiment. Referring to FIG. 3D again, the substrate 21 is clamped between the substrate frame 20 and the support frame 30. Since the substrate frame 20 and the support frame 30 are rigid bodies made of hard material, a problem of mechanical error may occur. The role of the clamp adjusting structure 36 may ensure that the substrate 21 can be firmly clamped between the substrate frame 20 and the support frame 30.

Referring to FIGS. 3B and 3C, the elevation adjusting structure 37 comprises a plurality of recesses 370 and a plurality of press plates 371. Each recess 370 is formed on the third surface 304 and provided at a bottom surface thereof with at least one second threaded hole 3700. In this embodiment, the third surface 304 of each side member of the support frame 30 is provided with two recesses 370; however, the number and locations of the recesses 370 may be determined subject to the size of the support frame 30 or actual requirement and not limited to the design of this embodiment. The press plates 371 are received in the recesses 370, respectively. Each press plate 371 has at least one second through hole 3710 in alignment with the at least one second threaded hole 3700 of the associated recess 370. At least one spacer 372, such as washer, is disposed between paired second through hole 3710 and second threaded hole 3700, and an elevation adjusting screw 373 is engaged in the paired second through hole 3710 and second threaded hole 3700. Specifically speaking, at least one spacer 372 is disposed between each paired recess 370 and press plate 371 and corresponds to the associated second through hole 3710 and second threaded hole 3700, and the elevation adjusting screw 373 is threaded into the second threaded hole 3700 through the associated second through hole 3710 and the at least one spacer 372 in a way that each of the press plates 371 presses at least one spacer 372 in the associated recess 370. Since the spacer 372 has a certain thickness, the distance between the press plate 371 and the bottom surface of the recess 370 can be adjusted by the amount of the spacer 372. It is to be mentioned that the thickness and amount of the spacer 372 have no specific limit. In fact, they may be determined subject to actual need. Further, if a single elevation adjusting screw 373 passes through two or more spacers 372, two adjacent spacers 372 of the aforesaid two or more spacers 372 may have different thickness. It is to be understood that the spacer 372 may be installed in a manner that the elevation adjusting screw 373 does not penetrate through the spacer 372. In another embodiment of the present invention, at least one spacer 372 may be set on the bottom surface of the recess 370 between two adjacent second threaded holes 3700, and the elevation adjusting screw 373 may pass through respective second through hole 3710 and be directly threaded into respective second threaded hole 3700, such that the spacer 372 is sandwiched between the bottom surface of the recess 370 and the press plate 371 so as to lift the press plate 371 away from the bottom surface of the recess 370 at a predetermined height. By means of the position adjusting module 3, the pads of the substrate 21 can be accurately positioned for facilitating assembly of the circuit board required in the probe card. Further, by means of the alignment adjusting mechanism 2 and/or the position adjusting module 3, the parts thereof need not to be orderly aligned one after another on the circuit board during assembly and disassembly, thereby saving time in assembly or disassembly and having the advantages of convenience in dismantling, ease in replacing parts, saving costs, and convenience in repair.

Figure 5:
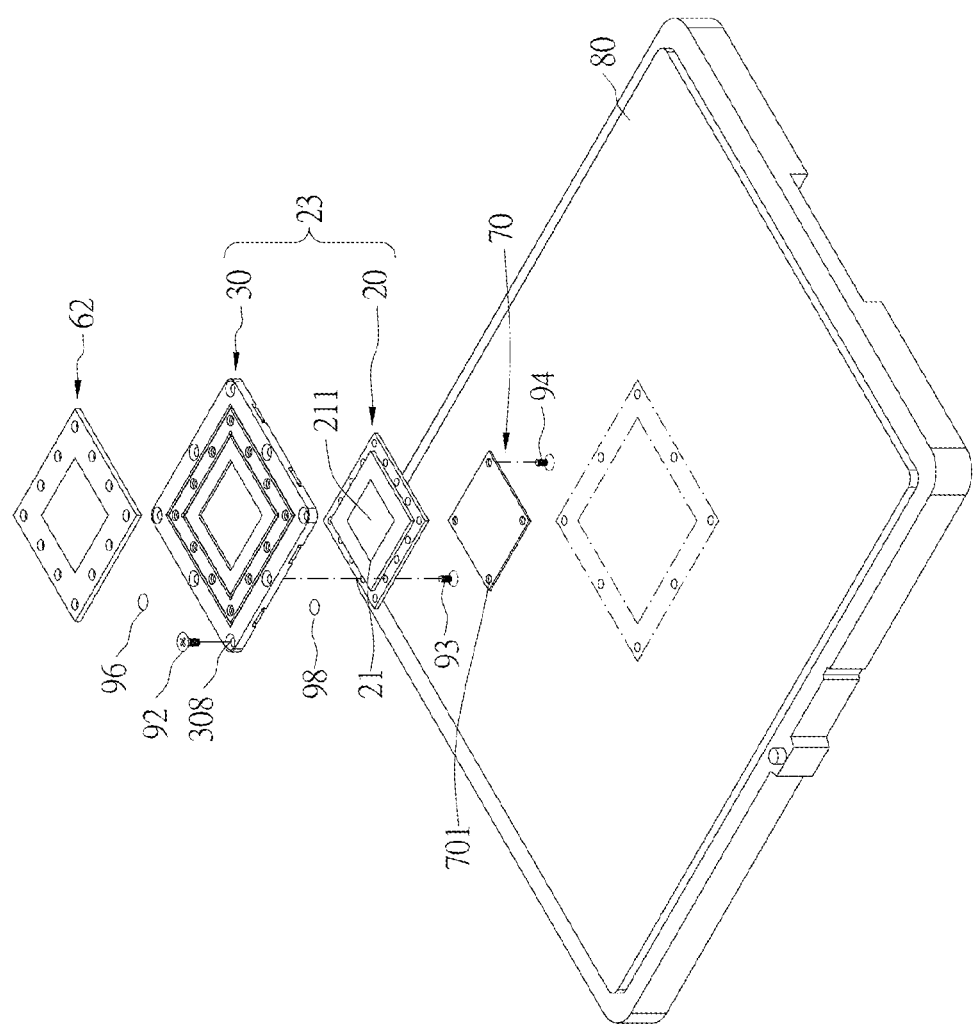
FIG. 5 is similar to FIG. 4, but illustrating that the modularized probing device is partially exploded.

Referring to FIGS. 4 and 5, these figures show that a modularized probing device 60 of an embodiment of the present invention is installed on a support board 80 through an anisotropic conductive layer 70. The probing device 60 is primarily composed of a probe head 62 having probe needles (not shown), and a space transformer module 64 having a holder 23, a space transformer 21 disposed in the holder 23 and adjustable in its planimetric position, and a planimetric position adjusting mechanism 22. The probing device 60 is modularly and detachably mounted on the support board 80 which may be a printed circuit board or a prober interface board. Referring to FIG. 4 to FIG. 7A, the space transformer 21, i.e. the substrate 21 illustrated in the preceding embodiments, has a first surface 210 and a second surface 211 opposite to the first surface 210. On the first surface 210, a plurality of pads (not shown) are provided for being electrically connected with the electric contacts of the support board 80, respectively. On the second surface 211, a plurality of pads (not shown) are provided for being electrically connected with the probe needles of the probe head 62, respectively. The probe head 62 having the probe needles is fastened to the holder 23.

Referring to FIG. 4 to FIG. 7A again, in this embodiment the holder 23 is composed of a first holder part 20, i.e. the substrate frame 20 recited in the preceding embodiment, and a second holder part 30, i.e. the support frame 30 recited in the preceding embodiment. The holder 23 has a receiving space S as shown in FIG. 7A. In this embodiment, the receiving space S of the holder 23 is formed by the first opening 200 of the substrate frame 20 and the second opening 300 of the support frame 30.

Figure 7A:
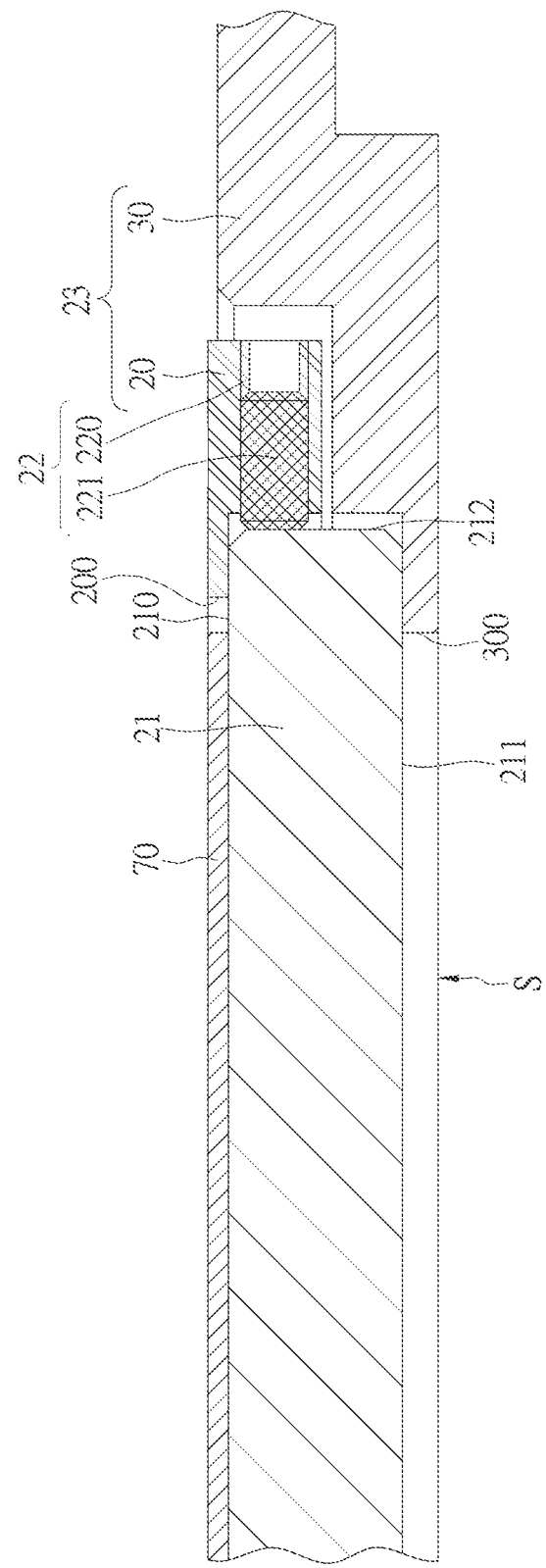
FIG. 7A is a schematically sectional view taken along the line 7A-7A of FIG. 6.
Figure 7B:
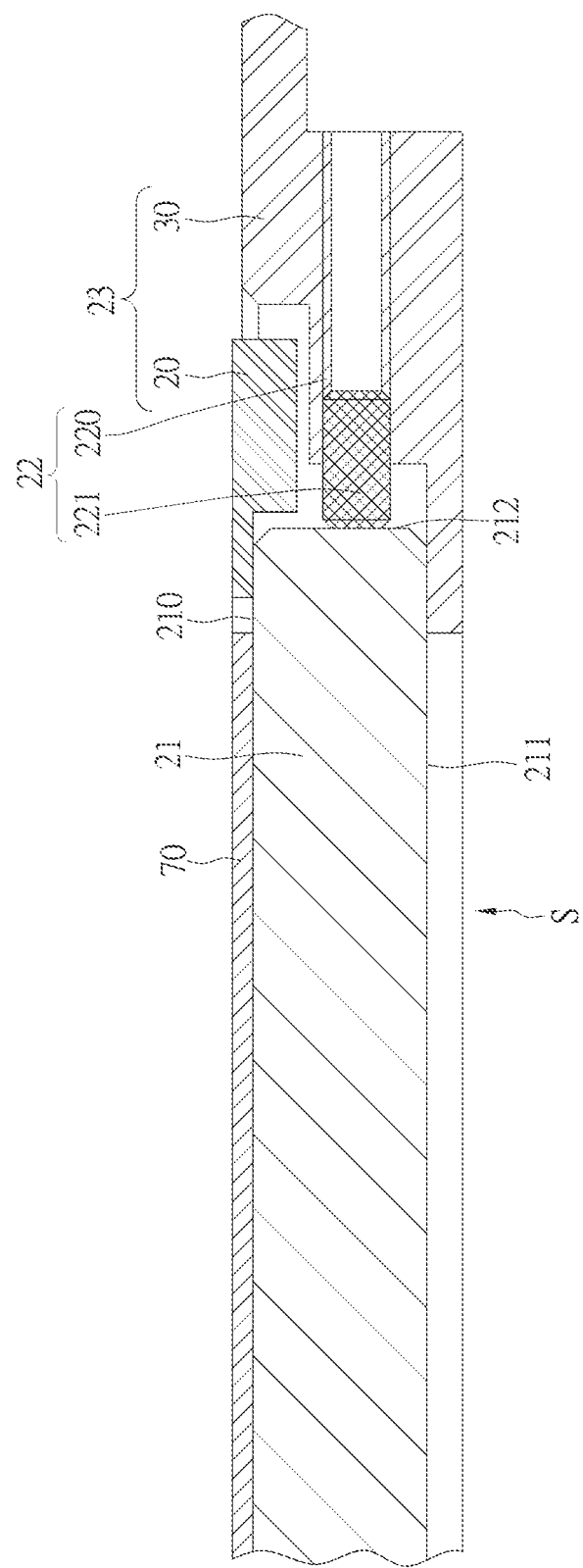
FIG. 7B is similar to FIG. 7A, but showing that the planimetric position adjusting structure is provided at the support frame.
Figure 7C:
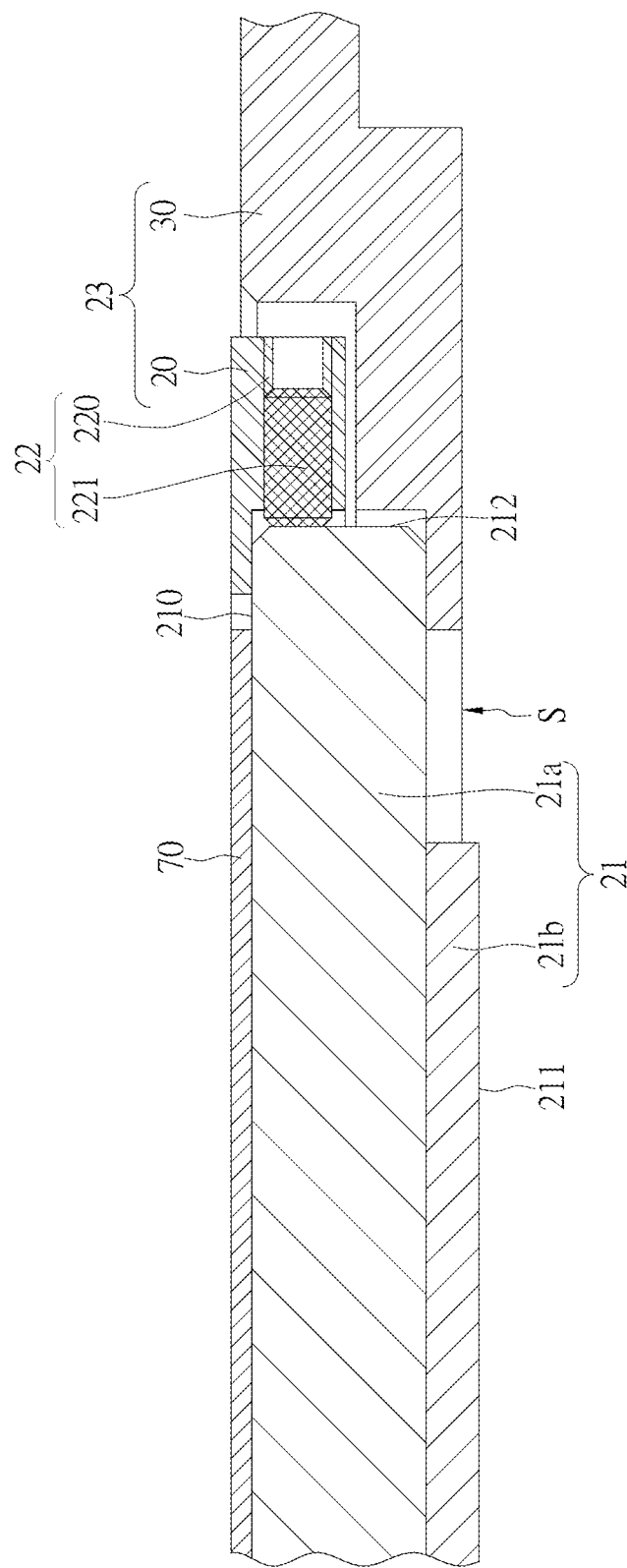
FIG. 7C is similar to FIG. 7A, but showing that the substrate (space transformer) is composed of a multi-layered ceramic member and a multi-layered organic member mechanically bonded to and electrically connected with the multi-layered ceramic member.

As shown in FIG. 7A, the positioning threaded holes 220 of the planimetric position adjusting mechanism 22 are provided at the first holder part (substrate frame) 20, and the ends of the positioning screws 221 protrude into the receiving space S and are stopped at the lateral side 212 of the space transformer 21 for adjusting the position of the space transformer 21 on the XY plane and then securing the space transformer 21 in position inside the holder 23. Referring to FIG. 4, the second holder part 30 of the holder 23 is provided with a plurality of through holes 308 through which fasteners 92 respectively pass for fastening the holder 23 on the support board 80. The fasteners 92 may be, but not limited to, screws or bolts. Any suitable way for fastening the holder 23 on the support board 80 may be used in the present invention. In this way, the holder 23 having the first holder part 20 and the second holder part 30 and receiving therein the space transformer 21 can be conveniently fastened on or detached from the support board 80.

In light of the above, the assembly of the holder 23 receiving the space transformer 21, i.e. the assembly of the space transformer module 64, can be completed by the assembly factory before the support board 80 compatible with the space transformer 21 is delivered to the assembly factory by a supplier of the support board 80. As soon as the support board is received by the assembly factory, the assembly of the final product can be carried out without any delay. Compared to the prior arts, the parts of the present invention need not to be assembled one after another so as to achieve the effects of saving time in assembly or disassembly and having the advantage of convenience in dismantling.

Figure 6:
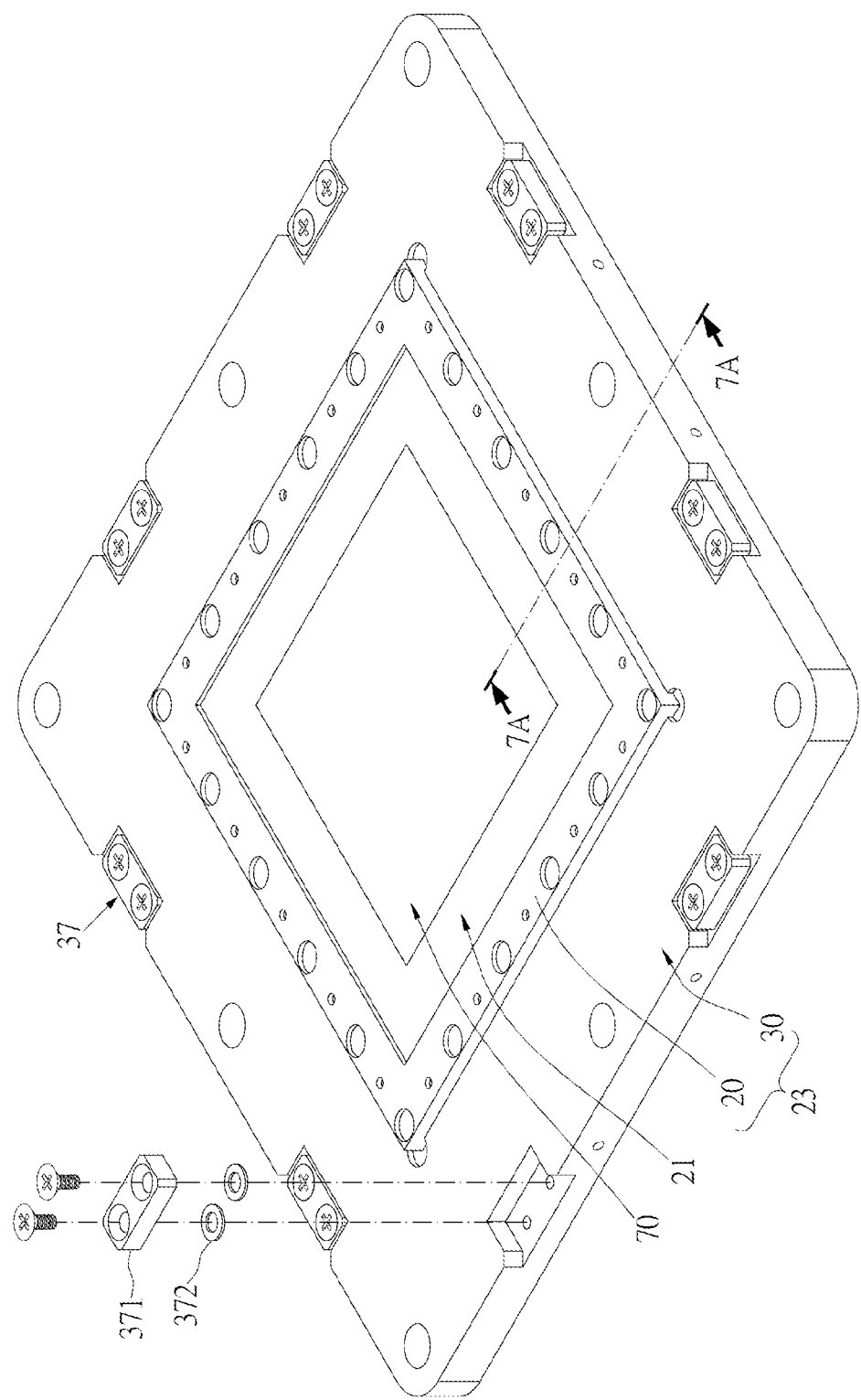
FIG. 6 is a schematic perspective view illustrating the modularized probing device, on the space transformer of which the anisotropic conductive layer is attached.

FIG. 6 shows a holder 23 receiving therein a space transformer 21 that has been electrically connected with an anisotropic conductive layer 70. FIGS. 7A and 7C show that the positioning screws 221 extend from the first holder part (substrate frame) 20 into the receiving space S and stop against the lateral side 212 of the space transformer 21. By turning the positioning screw 221, the extending length of the positioning screw 221 in the receiving space S can be adjusted so as to further adjust the position of the space transformer 21 and secure the space transformer 21 to the first holder part 20. In another embodiment illustrated in FIG. 7B, the positioning threaded holes 220 are provided at the second holder part (support frame) 30 in a way that the positioning threaded holes 220 penetrate through the second holder part 30 from the outer periphery wall to the inner periphery wall thereof, and the positioning screws 221 extend from the second holder part 30 into the receiving space S and stop against the lateral side 212 of the space transformer 21 for adjusting the position of the space transformer 21 and securing the space transformer 21 in the second holder part 30. In other words, the positioning screws 221 may be applied in a way that they extend from the first holder part 20 or the second holder part 30 into the receiving space S according actual need.

Referring to FIGS. 4 and 5 again, the probing device 60 may be designed as a module having an anisotropic conductive layer 70 to be disposed between the support board 80 and the space transformer 21 for enabling electric connection between the space transformer 21 and the support board 80 in a thickness orientation of the anisotropic conductive layer 70. The thickness orientation of the anisotropic conductive layer 70 indicates the direction from the space transformer 21 to the support board 80 and vice versa. In other words, the anisotropic conductive layer 70 can be mounted to the holder 23 in a way that the anisotropic conductive layer 70 is electrically connected with the first surface 210 of the space transformer 21 in advance. Thereafter, the modularized probing device 60 that comprises the space transformer 21, the holder 23 and the anisotropic conductive layer 70 can be installed on the support board 80 for enabling the anisotropic conductive layer 70 to be electrically connected with both of the support board 80 and the first surface 210 of the space transformer 21. It is to be mentioned that the anisotropic conductive layer 70 has a plurality of through holes 701 through which fastens 94 respectively pass for fastening the anisotropic conductive layer 70 to the first holder part 20 in a manner that the anisotropic conductive layer 70 is electrically connected with the space transformer 21. Alternatively, the fasteners 94 may pass through the through holes 701 of the anisotropic conductive layer 70 for electrically fastening the anisotropic conductive layer 70 to the support board 80. The fasteners 94 may be, but not limited to, screws or bolts. Any suitable way for fastening the anisotropic conductive layer 70 to the support board 80 or the first holder part 20 may be used in the present invention.

For the anisotropic conductive layer 70, an anisotropic conductive film (ACF), the interposer denoted by reference numeral 504 in TW patent No. 293938, the spring member denoted by reference numeral 32 in TW patent No. 1266057, or the spring connectors denoted by reference numeral 214 in US patent publication No. 20120169367 may be used.

It is to be understood the test of probing wafer is a kind of precision test. A minor error in dimension may result in that the pads on the first surface 210 of the space transformer 21 may not be precisely aligned and directly contacted with the electric contacts of the support board 80, respectively. As shown in FIG. 5, the substrate 21 is indirectly and electrically connected with support board 80 through the anisotropic conductive layer 70. In either direct electric connection or indirect electric connection of the substrate 21 with the support board 80, the positioning screws 221 need to be involved to adjust the position of the space transformer 21 inside the holder 23 on XY plane for running the aforesaid precision test properly.

In practice, the probing device 60 may be used in a circuit probing test (CP). To run a final test (FT), the probing device 60 may be separated from the support board 80, and then a conventional probe head designed especially for the final test may be installed on the support board 80. In this way, the test factory may use a common support board 80 in circuit probing test and final test, and the thing that the test factory needs to do is to switch the probing device 60 of the present invention and to switch the conventional probe head designed for the final test. Therefore, the probing device 60 of the present invention has the advantages of convenience in assembly and disassembly and saving costs. Further, if a part of the probing device 60 needs to be repaired or replaced, the part needed to be repaired or replaced will be the space transformer 21, holder 23, probe head 62 or the anisotropic conductive layer 70. This means that the parts of the probing device 60 of the present invention need not to be dismantled from the support board 80 one after another when a repair or replacement work is needed. For example, the whole probing device 60 may be dismantled from the support board, or only the probe head 62 may be dismantled from the holder 23 for repairing or replacing purpose. As a result, the probing device 60 of the present invention has the advantages of ease in replacing parts and convenience in repair.

In an embodiment disclosed in FIG. 7C, the space transformer 21 is composed of a multi-layered ceramic member 21a and a multi-layered organic member 21b electrically bonded to the multi-layered ceramic member 21a by reflow soldering. The multi-layered ceramic member 21a is received in the receiving space S in a way that the positioning screws 221 extend from the first holder part 20 into the receiving space S and stop against the lateral side 212 of the multi-layered ceramic member 21a for adjusting the position of the multi-layered ceramic member 21a in the first holder part 20 on the XY plane and securing the multi-layered ceramic member 21a in good position in the first holder part 20. In this embodiment, the second surface 211 of the multi-layered organic member 21b is electrically connected with the probe head 62. In another embodiment, the positioning screws 221 may extend from the second holder part 30 into the receiving space S and stop against the lateral side 212 of the multi-layered ceramic member 21a for adjusting the position of the space transformer 21 and securing the space transformer 21 in the second holder part 30.

Referring to FIGS. 5 and 6 again, at least one spacer 96 may be disposed between the holder 23 and the probe head 62 for adjusting the elevation or horizontal level of the probe head 62 relative to the holder 23. Further, at least one spacer 372 may be disposed between the holder 23 and the support board 80 for adjusting the elevation or horizontal level of the holder 23 relative to the support board 80. As shown in FIG. 6, at least one elevation adjusting structure 37 may be provided at the holder 23. One or more spacers 372 may be disposed under the press plate 371 to lift the press plate 371 to an extent that the press plate 371 is abutted against the support board 80 so as to adjust the elevation or horizontal level of the holder 23 relative to the support board 80. Furthermore, as shown in FIG. 5 at least one spacer 98 may be disposed between the first holder part 20 and the second holder part 30 for adjusting the elevation or horizontal level of the first holder part 20 relative to the second holder part 30. The aforesaid spacers 372, 96 and 98 may be selectively used according to actual need. In another embodiment, the spacers 372, 96 and 98 may be fixed in position by screws, bolts or other similar fasteners. The way of fixing the spacers 372, 96 and 98 is not limited to the design disclosed in the present invention. In other words, any suitable way for fixing the spacers 372, 96 and 98 in position may be used.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An alignment adjusting mechanism for a probe card, comprising:
    a frame having an opening, an inner periphery wall surrounding around the opening, a support flange extending from the inner periphery wall towards a center of the opening, and an outer periphery wall;
    a substrate disposed in the opening of the frame and supported by the support flange; and
    a planimetric position adjusting structure comprising:
        a plurality of positioning threaded holes each penetrating through the frame from the outer periphery wall to the inner periphery wall; and
        a plurality of positioning screws each threaded into one of the positioning threaded holes and having an end stopped at a lateral side of the substrate,
    wherein the frame is a rectangular frame having four side members each provided with at least one said positioning threaded hole and corresponding to the lateral side of the substrate; the ends of the plurality of positioning screws stop at the four lateral sides of the substrate.

2. The alignment adjusting mechanism as claimed in claim 1, wherein the substrate is a space transformer.

3. The alignment adjusting mechanism as claimed in claim 2, wherein the substrate comprises a multi-layered ceramic member and a multi-layered organic member electrically connected with the multi-layered ceramic member; the ends of the positioning screws are stopped at a lateral side of the multi-layered ceramic member.

4. A position adjusting module for a probe card, comprising:
    an assembly of a substrate frame and a support frame, the assembly having an opening, an inner periphery wall surrounding around the opening, a support flange extending from the inner periphery wall towards a center of the opening, and an outer periphery wall;
    a substrate disposed in the opening of the assembly and supported by the support flange; and
    a planimetric position adjusting structure comprising:
        a plurality of positioning threaded holes each penetrating through the substrate frame from the outer periphery wall to the inner periphery wall; and
        a plurality of positioning screws each threaded into one of the positioning threaded holes and having an end stopped at a lateral side of the substrate,
    wherein the substrate frame is a rectangular frame having four side members each provided with at least one said positioning threaded hole and corresponding to the lateral side of the substrate, and the ends of the plurality of positioning screws stop at the four lateral sides of the substrate, and
    wherein the substrate frame has a first opening, an inner periphery wall surrounding around the first opening, a first support flange extending from the inner periphery wall of the substrate frame towards a center of the first opening, and an outer periphery wall; the substrate is supported by the first support flange of the substrate frame; the support frame has a second opening in which the substrate frame is received, an inner periphery wall surrounding around the second opening, and a second support flange extending from the inner periphery wall of the support frame towards a center of the second opening; the substrate frame is supported by the second support flange of the support frame.

5. The position adjusting module as claimed in claim 4, wherein the substrate is a space transformer comprising a multi-layered ceramic member and a multi-layered organic member electrically connected with the multi-layered ceramic member; the ends of the positioning screws are stopped at a lateral side of the multi-layered ceramic member.

6. The position adjusting module as claimed in claim 4, wherein the substrate frame has a plurality of alignment grooves, and the second support flange of the support frame has a plurality of insertion holes aimed at the alignment grooves one by one; each pair of said alignment groove and said insertion hole is inserted with an alignment pin.

7. The position adjusting module as claimed in claim 4, further comprising a plurality of first fastening screws; the substrate frame has a plurality of first through holes; the second support flange of the support frame has a plurality of first threaded holes aligned with the first through holes, respectively; the first fastening screws are respectively threaded into the first threaded holes through the first through holes for fixedly fastening the substrate frame to the support frame.

8. The position adjusting module as claimed in claim 4, further comprising a clamp adjusting structure comprising:
    a plurality of adjusting threaded holes penetrating through the substrate frame and aimed at the second support flange of the support frame; and
    a plurality of adjusting screws each threaded into one of the adjusting threaded holes and having an end stopped at the second support flange of the support frame.

9. The position adjusting module as claimed in claim 4, further comprising an elevation adjusting structure comprising:
    a plurality of recesses provided at a surface of the support frame and each having at least one second threaded hole;
    a plurality of press plates received in the recesses respectively and each having at least one second through hole in alignment with the at least one second threaded hole of associated said recess;
    a plurality of spacers; and
    a plurality of elevation adjusting screws respectively threaded into the second threaded holes through the second through holes in a way that each of the press plates presses at least one of the spacers in associated said recess.

10. The position adjusting module as claimed in claim 4, wherein the support frame further comprises a third support flange extending from the second support flange towards the center of the second opening for supporting the substrate.

11. A modularized probing device for being detachably and electrically connected with a support board of a probe card, the modularized probing device comprising:
    a holder for being detachably mounted to the support board of the probe card, the holder having a receiving space;
    a space transformer received in the receiving space of the holder and having a first surface for being electrically connected with the support board of the probe card and a second surface opposite to the first surface;
    a planimetric position adjusting structure comprising:
        a plurality of positioning threaded holes provided at the holder; and
        a plurality of positioning screws each threaded into one of the positioning threaded holes and having an end protruding into the receiving space of the holder and being stopped at a lateral side of the space transformer; and a probe head detachably mounted to the holder and provided with a plurality of probe needles electrically connected with the second surface of the space transformer.

12. The modularized probing device as claimed in claim 11, wherein the space transformer is one member selected from the group consisting of a multi-layered ceramic member, a multi-layered organic member, a multi-layered silicon member, a combination of a multi-layered ceramic member and a multi-layered organic member, and a combination of a multi-layered ceramic member and a flexible printed circuit board.

13. The modularized probing device as claimed in claim 11, wherein the holder comprises a substrate frame having a first opening serving as the receiving space, an inner periphery wall surrounding around the first opening, an outer periphery wall corresponding to the inner periphery wall, and a first support flange extending from the inner periphery wall; each of the positioning threaded holes penetrates through the substrate frame from the outer periphery wall to the inner periphery wall; the space transformer is supported by the first support flange.

14. The modularized probing device as claimed in claim 13, wherein the space transformer comprises a multi-layered ceramic member and a multi-layered organic member electrically connected with the multi-layered ceramic member; the ends of the positioning screws are stopped at a lateral side of the multi-layered ceramic member; the multi-layered organic member is electrically connected with the probe head.

15. The modularized probing device as claimed in claim 11, wherein the holder comprises:

a substrate frame having a first opening, an inner periphery wall surrounding around the first opening, an outer periphery wall corresponding to the inner periphery wall, and a first support flange extending from the inner periphery wall and supporting the space transformer; and a support frame having a second opening in which the substrate frame is received, an inner periphery wall surrounding around the second opening, an outer periphery wall corresponding to the inner periphery wall of the support frame, and a second support flange extending from the inner periphery wall of the support frame and supporting the substrate frame;

wherein the first opening of the substrate frame and the second opening of the support frame combinedly form the receiving space of the holder;

wherein each of the positioning threaded holes penetrates through the substrate frame from the outer periphery wall of the substrate frame to the inner periphery wall of the substrate frame.

16. The modularized probing device as claimed in claim 15, wherein the space transformer comprises a multi-layered ceramic member and a multi-layered organic member electrically connected with the multi-layered ceramic member; the ends of the positioning screws are stopped at a lateral side of the multi-layered ceramic member; the multi-layered organic member is electrically connected with the probe needles of the probe head.

17. The modularized probing device as claimed in claim 16, further comprising at least one spacer disposed between the holder and the probe head, between the holder and the support board of the probe card for detachably mounting the holder, or between the substrate frame and the support frame.

18. The modularized probing device as claimed in claim 11, further comprising an anisotropic conductive layer electrically connected with the first surface of the space transformer; when the modularized probing device is connected with the support board of the probe card, the anisotropic conductive layer electrically connected with the first surface of the space transformer and the support board of the probe card.

* * * * *